US011011646B2

(12) United States Patent
Liu

(10) Patent No.: US 11,011,646 B2
(45) Date of Patent: May 18, 2021

(54) TFT STRUCTURE BASED ON FLEXIBLE MULTI-LAYER GRAPHENE QUANTUM CARBON SUBSTRATE MATERIAL AND METHOD FOR MANUFACTURING SAME

(71) Applicant: Guang Dong Dongbond Technology Co., Ltd., Guangdong (CN)

(72) Inventor: Ping Liu, Guangdong (CN)

(73) Assignee: Guang Dong Dongbond Technology Co., Ltd., Guangdong (CN)

( * ) Notice: Subject to any disclaimer, the term of this patent is extended or adjusted under 35 U.S.C. 154(b) by 15 days.

(21) Appl. No.: 16/255,801

(22) Filed: Jan. 23, 2019

(65) Prior Publication Data
US 2019/0157463 A1 May 23, 2019

Related U.S. Application Data
(63) Continuation of application No. PCT/CN2016/102464, filed on Oct. 18, 2016.

(51) Int. Cl.
*H01L 29/786* (2006.01)
*H01L 29/16* (2006.01)
*H01L 29/66* (2006.01)
*H01L 27/12* (2006.01)
*H01L 21/8256* (2006.01)

(52) U.S. Cl.
CPC .... *H01L 29/78687* (2013.01); *H01L 21/8256* (2013.01); *H01L 27/1218* (2013.01); *H01L 29/1606* (2013.01); *H01L 29/66045* (2013.01)

(58) Field of Classification Search
CPC ............ H01L 29/1606; H01L 29/0665; H01L 21/76224; H01L 29/78696; H01L 21/76289
See application file for complete search history.

(56) References Cited

U.S. PATENT DOCUMENTS

2012/0211723 A1* 8/2012 Dimitrakopoulos ........................
H01L 21/02378
257/9
2013/0015445 A1 1/2013 Liao
(Continued)

FOREIGN PATENT DOCUMENTS

CN 1825548 8/2006
CN 101834206 9/2010
(Continued)

*Primary Examiner* — Alia Sabur
(74) *Attorney, Agent, or Firm* — Winston Hsu

(57) ABSTRACT

A TFT structure based on a flexible multi-layer graphene quantum carbon substrate material and a method for manufacturing the same. The TFT structure includes a multi-layer graphene quantum carbon substrate, a first source, a first drain, a first gate insulating layer, and a first gate. The multi-layer graphene quantum carbon substrate includes a first channel area, and a first drain area and a first source area that are located at corresponding recessed positions on the multi-layer graphene quantum carbon substrate that are separated from each other. The first channel area is located between the first drain area and the first source area, the first source is filled in the first source area, the first drain is filled in the first drain area, the first gate insulating layer is disposed on the first channel area, and the first gate is disposed on the first gate insulating layer.

5 Claims, 2 Drawing Sheets

(56) References Cited

U.S. PATENT DOCUMENTS

| | | | |
|---|---|---|---|
| 2016/0111180 A1 | 4/2016 | Joo | |
| 2016/0148833 A1* | 5/2016 | Lin | ........... H01L 29/4991 |
| | | | 257/522 |
| 2018/0012962 A1* | 1/2018 | Yeh | ........... H01L 29/1033 |
| 2018/0248019 A1* | 8/2018 | Robinson | ....... H01L 29/66742 |

FOREIGN PATENT DOCUMENTS

| | | |
|---|---|---|
| CN | 102651339 | 8/2012 |
| CN | 103229305 | 7/2013 |
| CN | 104505370 | 4/2015 |
| CN | 105514121 | 4/2016 |
| CN | 105600782 | 5/2016 |
| CN | 105914148 | 8/2016 |
| JP | 2003298065 | 10/2003 |
| WO | 2013015573 | 1/2013 |

* cited by examiner

TFT STRUCTURE BASED ON FLEXIBLE MULTI-LAYER GRAPHENE QUANTUM CARBON SUBSTRATE MATERIAL AND METHOD FOR MANUFACTURING SAME

CROSS REFERENCE TO RELATED APPLICATIONS

This application is a continuation application of International Application No. PCT/CN2016/102464 filed on 2016 Oct. 18. The contents of the above-mentioned application are all hereby incorporated by reference.

BACKGROUND OF THE INVENTION

1. Field of the Invention

The present invention relates to a thin film transistor (TFT) structure based on a flexible multi-layer graphene quantum carbon substrate material and a method for manufacturing the same.

2. Description of the Prior Art

Conventional flexible thin film transistor (TFT) technologies include hydrogenated amorphous silicon TFTs, low temperature poly-silicon (LTPS) TFTs, and metal oxide TFTs. Amorphous silicon has a very low mobility ratio and is highly sensitive to illumination. Electrical characteristics of a device suffer serious deterioration under an applied voltage and an illumination condition, with a result that the amorphous silicon TFT technology cannot adapt to requirements of a novel flexible display technology. The LTPS TFT enhances the mobility ratio. A liquid crystal display using a poly-silicon technology has a higher aperture ratio, a higher resolution, a quicker response speed, and a higher integration degree than a liquid crystal display using an amorphous silicon technology. However, a process for preparing low temperature poly-silicon is relatively complicated, the process temperature is high, and large-area uniformity has a problem. Requirements of an organic TFT for preparation conditions are not high, the process temperature is usually not higher than 200° C., and the technology is compatible with a flexible electronic technology and is an environmentally friendly novel transistor technology. However, at present, there is still a long way to apply organic TFTs commercially on a large scale mainly because a device is highly sensitive to vapor in atmosphere and temperature and stability of the device needs to be further improved. An oxide TFT has good electrical performance, has a higher mobility ratio and on-off current ratio, satisfies current display requirements of large capacity and high definition, and especially has a broad prospect in application to drives of AMOLEDs. However, the mobility ratio of carriers needs to be further enhanced.

Chinese Patent Application No. 201610701057.3 that has not been published discloses a method for manufacturing a flexible multi-layer graphene quantum carbon-based substrate. The content is cited as follows.

To resolve the foregoing problem, the present invention provides a method for preparing a multi-layer graphene quantum carbon-based two-dimensional semiconductor material, to form a bandgap controllable flexible multi-layer graphene quantum carbon substrate two-dimensional semiconductor material, which is suitable for large-area, roll-to-roll, continuous batch production at low costs.

The present invention provides a method for preparing a multi-layer graphene quantum carbon-based semiconductor material, including: S1: using a polyimide film (a PI film) as a raw material to perform polymer sintering under a first temperature, removing H, O, and N atoms, and forming a microcrystalline carbon precursor; S2: adjusting to a second temperature and graphitizing the carbon precursor, to form a multi-layer graphene quantum carbon-based two-dimensional semiconductor material. At least in the step S2, a nano-metallic material is doped, to form quantum dots in the multi-layer graphene.

Preferably, the first temperature is divided into three sections, that is, the temperature for removing H atoms is 900° C.-1100° C., the temperature for removing O atoms is 1800° C.-2200° C., and the temperature for removing N atoms is 2700° C.-3300° C.

Furthermore, preferably, the first temperature is divided into three sections, that is, the temperature for removing H atoms is 1000° C., the temperature for removing O atoms is 2000° C., and the temperature for removing N atoms is 3000° C.

Preferably, the second temperature is 2000° C.-3500° C.

Furthermore, preferably, the second temperature is divided into two sections, the temperature of the first section is 2000° C.-2500° C. and the temperature of the second section is 2500° C.-3500° C.

Preferably, the doped nano-metallic material includes an alloy including at least one or at least two of Ca, Sb, Nb, Y, Mo, Si, As, In, Hf, and Ga. A particle size of the nano-metallic material is 2-5 nm.

Furthermore, preferably, the doped nano-metallic material is InAs, to form a multi-layer graphene quantum carbon-based two-dimensional semiconductor material with InAs quantum dots.

The present invention provides a multi-layer graphene quantum carbon-based two-dimensional semiconductor material that is obtained by using the foregoing preparation method.

Advantageous effects of the present invention include: carbonizing and graphitizing a PI film and preparing a flexible graphene morphological structure having hexagonal planar network molecular structures that are arranged in order. The structure has a great curvature and very small in-plane dispersion and deviation degree. The quantum dots are formed through doping the nano-metallic material, to realize opening and control of a bandgap. The preparation method can also support large-area, roll-to-roll, continuous batch production at low costs.

The multi-layer graphene quantum carbon-based two-dimensional semiconductor material prepared through the method can be applied to prepare a material such as a high-performance field effect transistor and a quantum computing chip semiconductor.

In an embodiment, a method for preparing a multi-layer graphene quantum carbon-based two-dimensional semiconductor material includes: S1: using a PI film as a raw material to perform polymer sintering under a first temperature, removing H, O, and N atoms, and forming a microcrystalline carbon precursor; S2: adjusting to a second temperature and graphitizing the carbon precursor, to form a multi-layer graphene quantum carbon-based two-dimensional semiconductor material. At least in the step S2, a nano-metallic material is doped, to form quantum dots in the multi-layer graphene.

In a preferred embodiment, the PI film is a novel transparent polyimide film prepared in the prior art CN 103289402 A. The PI film is obtained through hybridizing aromatic diamines and aromatic poly anhydride, introducing methyl to prepare polyimide, and then performing cyclodehydration, polycondensation, and imidization. The film has good orientation and a characteristic of high birefraction. When the film is carbonized and graphitized, thickness expansion and length vibration in a plane direction both become small. Therefore, disorder of tendency is reduced, line orientation is enhanced, and intensity is enhanced. The film is not easily broken and can be heated and pressed arbitrarily without being damaged.

The PI film is carbonized after polymer sintering and H, O, and N atoms are removed, so that polymer thermal treatment is close to the temperature of single crystalline graphite, C atoms are rearranged, to forma microcrystalline aromatic heterocyclic compound having a large continuum and finally form a microcrystalline carbon precursor having a good artificial heterogenous graphite structure. The carbon precursor may embody plane characteristics. The carbon precursor is graphitized, the carbon structure is recombined, carbon atoms at a microcrystalline edge are accelerated under a high temperature to move more quickly, the microcrystalline atoms are bonded mutually to generate macromolecules, hexangular mesh construction and combination begin and crystallization alignment is performed, a hexangular carbon grid layer is formed and grows gradually and is changed from one shaft to two shafts, to generate a flexible graphene morphological structure that has a large tortuosity, and very small in-plane dispersion and deviation degree.

In a preferred embodiment, for polymer sintering and carbonization, the temperature for removing H atoms is 900° C.-1100° C., the temperature for removing O atoms is 1800° C.-2200° C., and the temperature for removing N atoms is 2700° C.-3300° C.

In another preferred embodiment, for polymer sintering and carbonization, the temperature for removing H atoms is 1000° C., the temperature for removing O atoms is 2000° C., and the temperature for removing N atoms is 3000° C.

In a preferred embodiment, the graphitizing temperature is 2000° C.-3500° C.

In another preferred embodiment, graphitizing is divided into two stages, the reaction temperature at the first stage is 2000° C.-2500° C. and the reaction temperature at the second stage is 2500° C.-3000° C.

In a further preferred embodiment, graphitizing is performed under $1.4 \times 10^{-8}$-$1.8 \times 10^{-8}$ mm Hg, more preferably under $1.6 \times 10^{-8}$ mm Hg.

A peak G of a crystalline structure formed by the PI film after carbonization and graphitizing is located at the right side of 1582.6 $cm^{-1}$, a secondary peak is a 2D double-peak structure and is located at 2719.8 $cm^{-1}$, a D peak 1363 $cm^{-1}$ at the right side of G peak is very small and has less structural defects. The multi-layer graphene form is two-dimensional crystallization. Atoms are arranged in order according to a rule of a hexangular construction to form a planar hexangular grid form. Each carbon atom is formed by jointing three carbon atoms, one of four shell electrons in chemical combination is in a freely moving state, and the free electron can move along the crystalline grid. Therefore, graphene has a high conductivity in a plane direction.

During a carbonizing and graphitizing process, a nano-metallic material is doped to form quantum dots, to prepare a two-dimensional multi-layer graphene quantum carbon base and realize opening and control of a graphene bandgap. A nano transitional metal and graphene are connected through a covalent bond, when electron clouds are overlapped, they have a conjugated system (delocalization π bond), two atoms share electron pairs, the electrons get across a nano barrier to form a Fermi electron sea, electrons pass through a quantum barrier from one quantum well to another quantum well, to form a quantum tunneling effect, a structure effect, and a quantum confinement effect.

In a preferred embodiment, the doped nano-metallic material includes an alloy including at least one or at least two of Ca, Sb, Nb, Y, Mo, Si, As, In, Hf, and Ga.

In another preferred embodiment, the doped nano-metallic material is InAs, to form a multi-layer graphene quantum carbon-based two-dimensional semiconductor material with InAs quantum dots.

EXAMPLE 1

In an inert gas, the PI film is carbonized after polymer sintering, H, O, and N atoms are removed respectively at 1000° C., 2000° C., and 3000° C., C atoms are rearranged to form a carbon precursor. Under protection of the inert gas, the carbon precursor is graphitized under 2800° C., hexangular mesh construction and combination begin, a high purity single crystalline graphene construction is generated, two-dimensional carbon layers are hexagonal dense accumulation, have planar mesh molecules, and are arranged in order. During a carbonizing and graphitizing process, an InAs nano-metallic material is doped to form quantum dots, to prepare a multi-layer graphene quantum carbon-based two-dimensional semiconductor material, the density of quantum dots is $1 \times 10^{10}$-$3 \times 10^{10}$ $cm^{-2}$, and a width of a bandgap is 1.3-1.4 ev.

EXAMPLE 2

Example 2 differs from Example 1 in that, the doped nano-metallic material is a mixture of InAs and Sb, and the density of the formed quantum dots is $1.2 \times 10^{12}$ $cm^{-2}$. Through the quantum tunneling effect, an Sb element is added to InAs, to form $InSb_xAs_{1-x}$ quantum dots, and when a content x is adjusted, the width of the bandgap may be adjusted.

COMPARATIVE EXAMPLE 1

Comparative Example 1 differs from Example 1 or 2 in that, the PI film is carbonized after polymer sintering, H, O, and N atoms are removed respectively at 500° C., 600° C., and 800° C., and therefore, a multi-layer graphene quantum carbon-based two-dimensional semiconductor material cannot be formed.

SUMMARY OF THE INVENTION

To overcome the defects of the prior art, the present invention provides a thin film transistor (TFT) structure based on a flexible multi-layer graphene quantum carbon substrate material and a method for manufacturing the same, to enhance the mobility ratio of carriers and prepare a large-area flexible TFTs at low costs, thereby manufacturing flexible electronic devices.

A TFT structure based on a flexible multi-layer graphene quantum carbon substrate material includes: a multi-layer graphene quantum carbon substrate, a first source, a first drain, a first gate insulating layer, and a first gate, where the multi-layer graphene quantum carbon substrate includes a first channel area, and a first drain area and a first source area that are located at corresponding recessed positions on the multi-layer graphene quantum carbon substrate that are separated from each other, the first channel area is located between the first drain area and the first source area, the first source is filled in the first source area, the first drain is filled in the first drain area, the first gate insulating layer is disposed on the first channel area, and the first gate is disposed on the first gate insulating layer.

Preferably, the TFT structure includes a second source, a second drain, a second gate insulating layer, and a second gate, where the multi-layer graphene quantum carbon substrate further includes a second channel area, and a second drain area, a second source area, and an isolation area that are located at corresponding recessed positions on the multi-layer graphene quantum carbon substrate that are separated from each other;

the second channel area is located between the second drain area and the second source area, the second source is filled in the second source area, the second drain is filled in the second drain area, the second gate insulating layer is disposed on the second channel area, and the second gate is disposed on the second gate insulating layer;

a first TFT structure and a second TFT structure are respectively formed at two sides of the isolation area, the first TFT structure includes the first drain, the first drain, the first gate insulating layer, the first gate, and the first channel area, and the second TFT structure includes a second source, a second drain, a second gate insulating layer, a second gate, and a second channel area; and an isolation area insulating layer is formed on an inner wall of the isolation area.

Preferably, the isolation area includes a gap in the isolation area insulating layer.

Preferably, the first source further includes a portion extending out of the first source area and located on a surface of the multi-layer graphene quantum carbon substrate and the first drain further includes a portion extending out of the first drain area and located on a surface of the multi-layer graphene quantum carbon substrate.

Preferably, the first source further includes a portion extending out of the first source area and located on a surface of the first channel area, the first drain further includes a portion extending out of the first drain area and located on a surface of the first channel area, and the first gate insulating layer is partially located on the first channel area, partially located on the first drain of the first channel area, and partially located on the first source of the first channel area.

Preferably, the second source further includes a portion extending out of the second source area and located on a surface of the multi-layer graphene quantum carbon substrate and the second drain further includes a portion extending out of the second drain area and located on a surface of the multi-layer graphene quantum carbon substrate.

Preferably, the second source further includes a portion extending out of the second source area and located on a surface of the second channel area, the second drain further includes a portion extending out of the second drain area and located on a surface of the second channel area, and the second gate insulating layer is partially located on the second channel area, partially located on the second drain of the second channel area, and partially located on the second source of the second channel area.

The present invention further provides a method for manufacturing a TFT structure based on a flexible multi-layer graphene quantum carbon substrate material, including:

S1: etching the multi-layer graphene quantum carbon substrate to form a first drain area and a first source area that are recessed and separated from each other;

S2: forming a first conducive layer on the multi-layer graphene quantum carbon substrate and etching the first conductive layer to form the first drain and the first source;

S3: forming an insulating layer on the multi-layer graphene quantum carbon substrate, the first drain, and the first source and etching the insulating layer to form a first gate insulating layer; and S4: forming a first gate on the gate insulating layer.

Preferably, in the step S1:

a second drain area, a second source area, and an isolation area that are recessed and separated from each other are further etched on the multi-layer graphene quantum carbon substrate, where a second channel area is located between the second drain area and the second source area;

in the step S2:

the first conductive layer is further etched to form a second drain and a second source, where the second source is filled in the second source area and the second drain is filled in the second drain area;

in the step S3:

the insulating layer is etched to further form a second gate insulating layer and an isolation area insulating layer, where the second gate insulating layer is disposed on the second channel area and the isolation area insulating layer is located on an inner wall of the isolation area; and the step S4 further includes forming a second gate on the second gate insulating layer.

Preferably, the isolation area includes a gap in the isolation area insulating layer.

Preferably, the first source further includes a portion extending out of the first source area and located on a surface of the multi-layer graphene quantum carbon substrate and the first drain further includes a portion extending out of the first drain area and located on a surface of the multi-layer graphene quantum carbon substrate.

Preferably, the first source further includes a portion extending out of the first source area and located on the first channel area, the first drain further includes a portion extending out of the first drain area and located on the first channel area, and the first gate insulating layer is partially located on the first channel area, partially located on the first drain of the first channel area, and partially located on the first source of the first channel area.

Preferably, the second source further includes a portion extending out of the second source area and located on a surface of the multi-layer graphene quantum carbon substrate and the second drain further includes a portion extending out of the second drain area and located on a surface of the multi-layer graphene quantum carbon substrate.

Preferably, the second source further includes a portion extending out of the second source area and located on the second channel area, the second drain further includes a portion extending out of the second drain area and located on the second channel area, and the second gate insulating layer is partially located on the second channel area, partially located on the second drain of the second channel area, and partially located on the second source of the second channel area.

In some embodiments, according to display of an XRD diffraction spectrum of the multi-layer graphene quantum carbon-based material, the multi-layer graphene quantum carbon-based material is a highly crystalline graphene phase composition (having a highly oriented diffraction peak of a C-shaft (002) crystal plane and (004) crystal plane), and has a hexangular (P63/mmc) crystalline structure. A spacing of planes in a (002) direction, that is, between horizontal crystal planes is 0.336 nm, unit cell parameters are a=b=0.246 nm and c=0.671 nm, a density is d=2.26 kg/m3, the unit cell parameter is slightly greater than the crystalline graphite (0.334 nm), and the density is equivalent to the graphite (2.20-2.28 kg/m3), and the film is a highly crystalline film.

In some embodiments, according to display of an X-ray photoelectron spectroscopy of the multi-layer graphene quantum carbon-based material, through XPS analysis, the main peak is a C peak, and there are still a small amount of peaks, that is, an O peak, an Si peak, a C and Na peak. Binding energy of the C1s peak is 284.6 ev, binding energy of the O1s peak is 532.3 ev, and an intensity of a spectral peak of C/O is greater than 9. The result shows that a carbon oxygen ratio of the graphene quantum carbon-based material is 9.5, and has excellent electrical conductivity.

In some embodiments, through Hall effect measurement, it can be obtained that, the electrical conductivity of the multi-layer graphene quantum carbon-based material is $1.2 \times 10^6$ S/m, and a Hall mobility ratio is 830 $cm^2$/Vs.

Advantageous effects of the present invention are that: the present invention can enhance the mobility ratio of carriers and prepare a large-area flexible TFT at low costs, thereby manufacturing flexible electronic devices These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
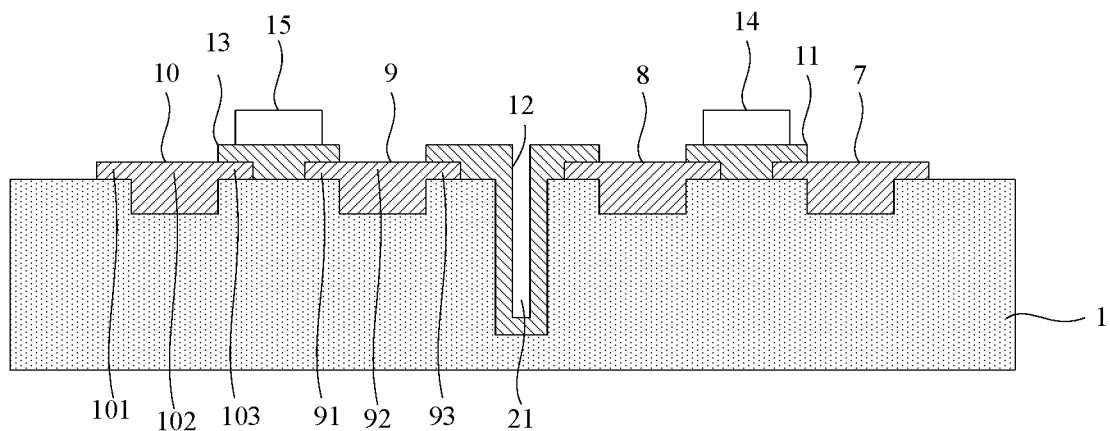
FIG. 1 is a schematic structural diagram of a thin film transistor (TFT) based on a flexible multi-layer graphene quantum carbon substrate material according to an embodiment of the present invention.

Preferred embodiments of the present invention are further described in detail below.

As shown in FIG. 1 to FIG. 5, a thin film transistor (TFT) structure based on a flexible multi-layer graphene quantum carbon substrate material according to an embodiment includes a multi-layer graphene quantum carbon substrate 1, a first source 10, a first drain 9, a first gate insulating layer 13, and a first gate 15, a second source 8, a second drain 7, a second gate insulating layer 11, and a second gate 14. The multi-layer graphene quantum carbon substrate includes a first channel area 51, a second channel area 31, and a first drain area 5, a first source area 6, a second drain area 3, a second source area 4, and an isolation area 2 that are located at corresponding recessed positions on the multi-layer graphene quantum carbon substrate 1 that are separated from each other. The first channel area 51 is located between the first drain area 5 and the first source area 6. The first source 10 is filled in the first source area 6. The first drain 9 is filled in the first drain area 5. The first gate insulating layer 13 is disposed on the first channel area 51. The first gate 15 is disposed on the first gate insulating layer 13. The second channel area 31 is located between the second drain area 3 and the second source area 4. The second source 8 is filled in the second source area 4. The second drain 7 is filled in the second drain area 3. The second gate insulating layer 11 is disposed on the second channel area 13. The second gate 14 is disposed on the second gate insulating layer 11.

A first TFT structure and a second TFT structure are respectively formed at two sides of the isolation area 2. The first TFT structure includes the first drain 10, the first drain 9, the first gate insulating layer 13, the first gate 15, and the first channel area 51, and the second TFT structure includes the second source 8, the second drain 7, the second gate insulating layer 11, the second gate 14, and the second channel area 31. An isolation area insulating layer 12 is formed on an inner wall of the isolation area 2.

The flexible multi-layer graphene quantum carbon substrate 1 has a typical thickness of 10-100 μm and is formed by stacking a plurality of graphene quantum carbon-based layers in a vertical direction. The multi-layer graphene quantum carbon substrate 1 is separated into a plurality of graphene islands by the isolation area 2. Each of the graphene islands consists of three areas, that is, a channel area corresponding to a gate, and a source area and a drain area outside the channel area.

In a preferred embodiment, the isolation area 2 includes a gap 21 in the isolation area insulating layer 12.

In a preferred embodiment, the first source 10 further includes a portion 101 extending out of the first source area 6 and located on a surface of the multi-layer graphene quantum carbon substrate 1, a portion 103 located on a surface of the first channel area 51, and a portion 102 located above the first source area 6. The first drain 9 further includes a portion 93 extending out of the first drain area 5 and located on a surface of the multi-layer graphene quantum carbon substrate 1, a portion 91 located on the surface of the first channel area 51, and a portion 92 located above the first drain area. The first gate insulating layer 13 is partially located on the surface of the first channel area 51, partially located on the portion 91 of the first drain on the first channel area, and partially located on the portion 103 of the first source on the first channel area 51.

In a preferred embodiment, the second source 8 further includes a portion extending out of the second source area 4 and located on a surface of the multi-layer graphene quantum carbon substrate 1, a portion located on a surface of the second channel area 31, and a portion located above the second source area 4. The second drain 7 further includes a portion extending out of the second drain area 3 and located on a surface of the multi-layer graphene quantum carbon substrate 1, a portion located on the surface of the second channel area 31, and a portion located above the second drain area. The second gate insulating layer 14 is partially located on the surface of the second channel area 31, partially located on the portion of the second drain on the second channel area 31, and partially located on the portion of the second source on the second channel area 31.

Figure 2:
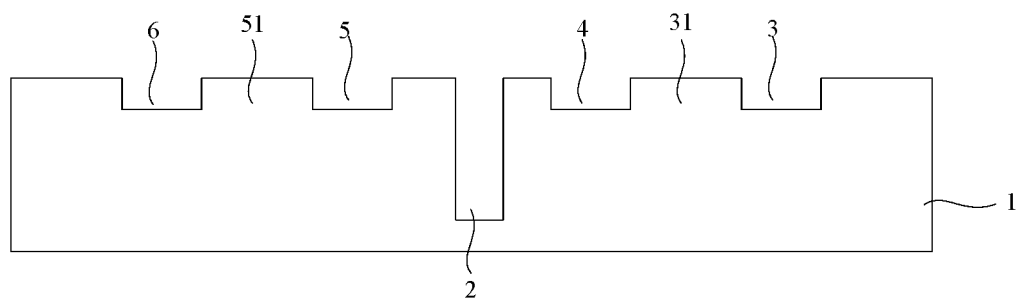
FIG. 2 is a schematic structural diagram of a manufacturing process of a TFT structure based on the flexible multi-layer graphene quantum carbon substrate material in FIG. 1.

A method for manufacturing a TFT structure based on a flexible multi-layer graphene quantum carbon substrate material includes the following steps:

S1: As shown in FIG. 2, etch the multi-layer graphene quantum carbon substrate 1 to form a first drain area 5, a first source area 6, a second drain area 3, a second source area 4, and an isolation area 2 that are recessed and separated from each other. For example, plasma etching may be used. In an embodiment, a depth of the source area and the drain area is 1-1000 nm, preferably 50 nm, and a depth of the isolation area 2 is 10-10000 nm, preferably 100 nm.

Figure 3:
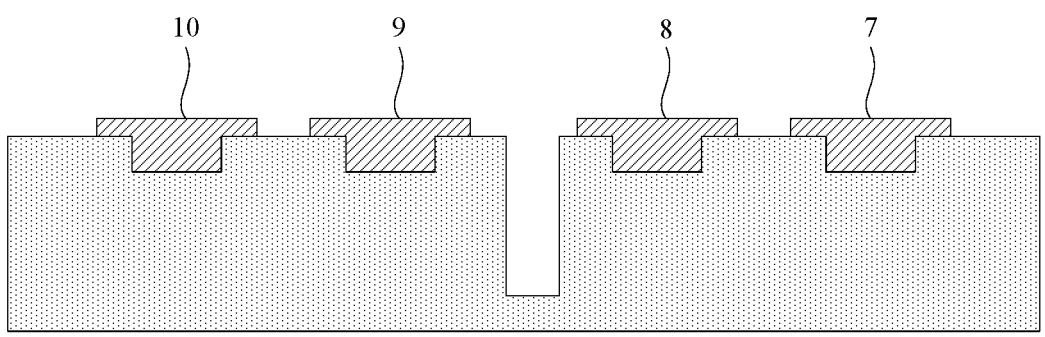
FIG. 3 is a schematic structural diagram of a manufacturing process of the TFT structure based on the flexible multi-layer graphene quantum carbon substrate material in FIG. 1.

S2: Form a first source 10, a first drain 9, a second source 8, and a second drain 7. As shown in FIG. 3, a magnetron sputtering method may be used to form a conductive film on a surface of the multi-layer graphene quantum carbon substrate 1 and in the first drain area 5, the first source area 6, the second drain area 3, and the second source area 4. The material of the conductive film may be a metal such as Al, Mo, Cr, Ag, and Au or an alloy thereof, a transparent conductive material, or a composite conductive material. Then, the conductive film is etched by using a wet etching process or a dry etching process to form the first source 10, the first drain 9, the second source 8, and the second drain 7.

Figure 4:
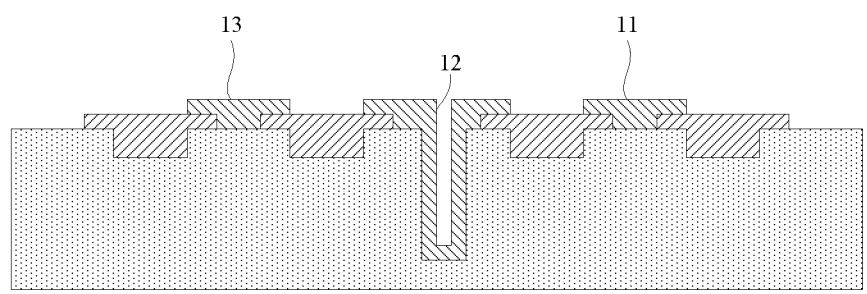
FIG. 4 is a schematic structural diagram of a manufacturing process of the TFT structure based on the flexible multi-layer graphene quantum carbon substrate material in FIG. 1.

S3: Form a first gate insulating layer 13 and a second gate insulating layer 11. As shown in FIG. 4, an insulating layer is formed on the surface of the multi-layer graphene quantum carbon substrate 1 and in the first source 10, the first drain 9, the second source 8, the second drain 7, and the isolation area 2 by a method such as atomic layer deposition, sputtering deposition, chemical vapor deposition, thermal evaporation, and spin coating. The material of the insulating layer may be an organic layer such as PMMA and PVA, an inorganic layer such as $SiO_2$, SiNx, $Al_2O_3$, HfO, $Ta_2O_3$, and TiO, or an organic/inorganic composite layer. Preferably, ALD is used to form a single $Al_2O_3$ layer, which preferably has a thickness of 5 nm-300 nm. The dry etching method is used to etch the insulating layer to form the first gate insulating layer 13, the second gate insulating layer 11, and an isolation area insulating layer 12 on an inner wall of the isolation area 2.

Figure 5:
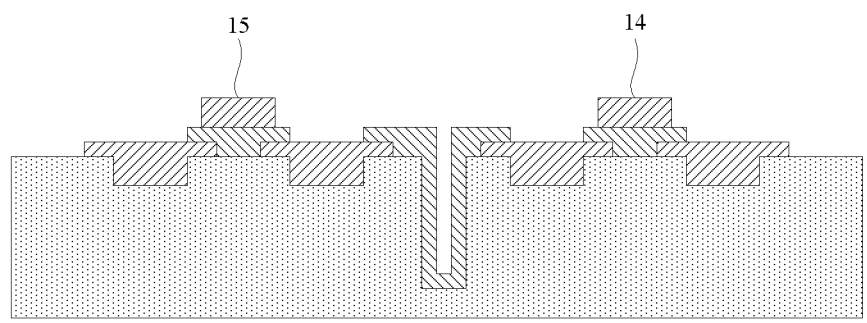
FIG. 5 is a schematic structural diagram of a TFT based on a flexible multi-layer graphene quantum carbon substrate material according to an embodiment of the present invention.

S4: Form the first gate 15 and the second gate 14. The first gate 15 and the second gate 14 may be on the same plane, that is, form a top gate coplanar structure. As shown in FIG. 5, the magnetron sputtering method may be used to form the conductive film. The material of the conductive film may be a metal such as Al, Mo, Cr, Ag, and Au or an alloy thereof, a transparent conductive material, or a composite conductive material. The conductive film is etched by using a wet etching process or a dry etching process to form the first gate 15 and the second gate 14.

S5: Form a passivation layer to protect the conductive film. The insulating layer for passivation is formed by a method such as atomic layer deposition, sputtering deposition, chemical vapor deposition, thermal evaporation, and spin coating. The material of the insulating layer may be an organic layer such as PMMA and PVA, an inorganic layer such as $SiO_2$, SiNx, $Al_2O_3$, HfO, $Ta_2O_3$, and TiO, or an organic/inorganic composite layer. Preferably, ALD is used to form a single $Al_2O_3$ layer, which preferably has a thickness of 5 nm-300 nm.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thin film transistor (TFT) structure based on a flexible multi-layer graphene quantum carbon substrate material, comprising: a multi-layer graphene quantum carbon substrate, a first source, a first drain, a first gate insulating layer, and a first gate, wherein the multi-layer graphene quantum carbon substrate comprises a first channel area, and a first drain area and a first source area that are located at corresponding recessed positions on the multi-layer graphene quantum carbon substrate that are separated from each other, the first channel area is located between the first drain area and the first source area, the first source is filled in the first source area, the first drain is filled in the first drain area, the first gate insulating layer is disposed on the first channel area, and the first gate is disposed on the first gate insulating layer; wherein the first source further comprises a first portion remote from the first gate, extending out of the first source area and located on a surface of the multi-layer graphene quantum carbon substrate and the first drain further comprises a first portion remote from the first gate, extending out of the first drain area and located on a surface of the multi-layer graphene quantum carbon substrate; wherein the first source further comprises a second portion close to the first gate, extending out of the first source area and located on a surface of the first channel area, the first drain further comprises a second portion close to the first gate, extending out of the first drain area and located on a surface of the first channel area, and the first gate insulating layer is partially located on the first channel area, partially located on a surface of the first drain located on the surface of the first channel area, and partially located on a surface of the first source located on the surface of the first channel area.

2. The TFT structure based on a flexible multi-layer graphene quantum carbon substrate material according to claim 1, further comprising:
   a second source, a second drain, a second gate insulating layer, and a second gate, wherein the multi-layer graphene quantum carbon substrate further comprises a second channel area, and a second drain area, a second source area, and an isolation area that are located at corresponding recessed positions on the multi-layer graphene quantum carbon substrate that are separated from each other;
   the second channel area is located between the second drain area and the second source area, the second source is filled in the second source area, the second drain is filled in the second drain area, the second gate insulating layer is disposed on the second channel area, and the second gate is disposed on the second gate insulating layer;
   a first TFT structure and a second TFT structure are respectively formed at two sides of the isolation area, the first TFT structure comprises the first drain, the first drain, the first gate insulating layer, the first gate, and the first channel area, and the second TFT structure comprises a second source, a second drain, a second gate insulating layer, a second gate, and a second channel area; and
   an isolation area insulating layer is formed on an inner wall of the isolation area.

3. The TFT structure based on a flexible multi-layer graphene quantum carbon substrate material according to claim 1, wherein the isolation area comprises a gap in the isolation area insulating layer.

4. The TFT structure based on a flexible multi-layer graphene quantum carbon substrate material according to claim 2, wherein
the second source further comprises a first portion remote from the second gate, extending out of the second source area and located on a surface of the multi-layer graphene quantum carbon substrate and the second drain further comprises a first portion remote from the second gate, extending out of the second drain area and located on a surface of the multi-layer graphene quantum carbon substrate.

5. The TFT structure based on a flexible multi-layer graphene quantum carbon substrate material according to claim 2, wherein
the second source further comprises a second portion close to the second gate, extending out of the second source area and located on a surface of the second channel area, the second drain further comprises a second portion close to the second gate, extending out of the second drain area and located on a surface of the second channel area, and the second gate insulating layer is partially located on the second channel area, partially located on a surface of the second drain located on the surface of the second channel area, and partially located on a surface of the second source located on the surface of the second channel area.

\* \* \* \* \*